United States Patent [19]

Proctor et al.

[11] Patent Number: 5,656,919
[45] Date of Patent: Aug. 12, 1997

[54] ACCURATE BATTERY STATE-OF-CHARGE MONITORING AND INDICATING APPARATUS AND METHOD

[75] Inventors: Richard L. Proctor, Seattle; George A. Ure, Kirkland; William L. Merkes; Richard H. Young, Jr., both of Seattle; Steven H. Kahle, Edmonds, all of Wash.

[73] Assignee: Cruising Equipment, Inc., Seattle, Wash.

[21] Appl. No.: 557,451

[22] Filed: Nov. 14, 1995

[51] Int. Cl.⁶ .................................................. H01M 10/48
[52] U.S. Cl. ............................ 320/30; 320/48; 324/427; 340/636; 429/90
[58] Field of Search .................................. 320/5, 12, 13, 320/19, 30, 31, 35, 39, 48; 324/427, 428, 431, 433; 340/635, 636; 429/90, 61

[56] References Cited

U.S. PATENT DOCUMENTS

| | | | |
|---|---|---|---|
| 3,886,442 | 5/1975 | Chiku et al. | 320/19 X |
| 3,938,507 | 2/1976 | Sarnoff et al. | |
| 3,971,980 | 7/1976 | Jungfer et al. | |
| 4,012,681 | 3/1977 | Finger et al. | |
| 4,390,841 | 6/1983 | Martin et al. | 324/427 |
| 4,565,880 | 1/1986 | Patil | 324/427 |
| 4,625,175 | 11/1986 | Smith | |
| 4,678,999 | 7/1987 | Schneider | |
| 4,679,000 | 7/1987 | Clark | |
| 4,715,381 | 12/1987 | Moberg | |
| 4,719,427 | 1/1988 | Morishita et al. | |
| 4,849,700 | 7/1989 | Morioka et al. | |
| 4,929,931 | 5/1990 | McCuen | |

(List continued on next page.)

OTHER PUBLICATIONS

Owners Manual, Part #890015, May 5, 1995.
Options and Accessories, Part #890019, May 1, 1995.
Additions and Errata, Part #890015A, May 25, 1995.
Landfors J, Simonsson D: Discharge Behavior of Tubular PbO2 Electrodes. I. Experimental Investigations. J Electrochem Soc 139(110):2760–2767, Oct. 1992.
Landfors, J, Simonsson D: Discharge Behavior of Tubular PbO2 Electrodes. II. Mathematical Model. J. Electrochem Soc 139(10):2768–2775, Oct. 1992.
Electrical System and Amp Hour Monitor Manual (Jul. 1989).
Power News, Vol. 2, Issue 1 (Feb. 1990).
Balanced Energy Systems Catalog (1990).
Installation Manual, AMP-hour+™ and AMP-hour+2™ meter (Jun. 10, 1994).

*Primary Examiner*—Edward Tso
*Attorney, Agent, or Firm*—Christenson O'Connor Johnson & Kindness PLLC

[57] ABSTRACT

The apparatus and method of monitoring and/or indicating an accurate state-of-charge of a battery compensates for varying current loads and changing temperature conditions. The apparatus and method compensate for the Peukert Effect which manifests itself when varying current loads are applied to the battery. Also, the apparatus and method may compensate for temperature changes in the environment of the battery. The extent of the Peukert Effect and temperature variation on the battery is based on intrinsic characteristics of the battery which may be experimentally defined. Specifically, preferred apparatuses include memories for storing various discharging/charging related values and a processor to calculate and determine values related to accurately monitoring the battery's state-of-charge. Also, the apparatus may include a battery state-of-charge indicator including a multi-segmented, multi-color LED display. The apparatuses and methods use a battery having a state-of-charge equal to the battery's charge capacity (CCAP). The battery's state-of-charge is tracked as it discharges/charges. Preferably, if the discharging current (i) is greater than or equal to a predefined discharging current (I), then the Peukert Equation is utilized to determine the actual discharge of the battery. If I<i, then Peukert Equation is not utilized because the Peukert Effect is not exhibited when i is below I.

31 Claims, 7 Drawing Sheets

U.S. PATENT DOCUMENTS

| | | |
|---|---|---|
| 4,947,123 | 8/1990 | Minezawa . |
| 4,949,046 | 8/1990 | Seyfang . |
| 4,952,862 | 8/1990 | Biagetti et al. . |
| 4,958,127 | 9/1990 | Williams et al. . |
| 5,032,825 | 7/1991 | Kuznicki . |
| 5,126,675 | 6/1992 | Yang . |
| 5,151,865 | 9/1992 | Blessing et al. . |
| 5,315,287 | 5/1994 | Sol . |
| 5,317,269 | 5/1994 | Mills et al. . |
| 5,321,627 | 6/1994 | Reher . |
| 5,349,540 | 9/1994 | Birkle et al. .......................... 324/427 |

ACCURATE BATTERY STATE-OF-CHARGE MONITORING AND INDICATING APPARATUS AND METHOD

TECHNICAL FIELD

The present invention relates generally to an apparatus and method for monitoring the state-of-charge of a battery. More particularly, the invention is an apparatus and method of monitoring and/or indicating the accurate state-of-charge of a battery used as a power source for an electrical load circuit and/or a battery being charged by a battery charger.

BACKGROUND ART

Rechargeable large-capacity batteries are commonly used in marine systems, alternative energy systems, recreational vehicle (RV) systems, industrial lift truck applications and electric vehicles. These applications typically use the so-called deep-cycle type, such as wet-cell and gel-cell batteries. Since these applications depend upon battery power for vital systems (such as locomotion), knowing the actual state-of-charge of a battery is very useful. Otherwise, if the battery's charge is depleted without sufficient warning, a user may be stranded and unable to reach a power source to recharge the battery.

Accurate monitoring of a battery's state-of-charge is significant for other reasons. A rechargeable battery may be damaged by excessive discharge or by under-charging. Accurate monitoring allows the battery to be recharged before the state-of-charge is excessively low and avoid under-charging, thereby increasing the life of the battery.

Among the methods used by existing battery monitors are a) detecting the specific gravity of the battery electrolyte; b) measuring the terminal voltages of the battery; and c) measuring and tracking over time the charge drawn from and supplied to the battery. However, none of these battery monitoring methods satisfactorily compensate for conditions that affect the actual battery capacity. In particular, such conditions include discharging/charging currents and changing ambient temperatures.

Specifically, the latter of the above-listed monitors is a relatively inexpensive type of battery monitor. These monitors require a baseline charge capacity of the battery's to be selected by a user and/or be experimentally determined. These types of monitors track the quantity of charge removed from and added to the battery relative to the baseline charge capacity of the battery. In practice, such monitors, however, typically are not sufficiently accurate for applications such as marine vessels and electric vehicles.

These monitors are not accurate because conditions differing from those which produced the baseline charge capacity alter the actual charge capacity of the battery. Again, these conditions include the discharging/charging current and the ambient temperature around the battery. Nonetheless, in many practical applications of large-capacity batteries, such as those listed above, the battery is typically subject to varying current loads (or charging currents) and changing temperature conditions.

DISCLOSURE OF THE INVENTION

The invented apparatus and method of monitoring and/or indicating an accurate state-of-charge of a battery compensates for varying current loads (or charges) and changing temperature conditions. The invention compensates for the Peukert Effect which manifests itself when varying current loads are applied to the battery. Also, the invention may compensate for temperature changes in the environment of the battery. The extent of the Peukert Effect and temperature variation on the battery is based on intrinsic characteristics of the battery which may be experimentally defined.

In a first preferred embodiment, the method involves the use of an electrical load circuit driven by an operatively connected battery, wherein such battery has an experimentally defined charge capacity (CCAP) substantially based on a predefined discharging current (I) during a depletion test of the battery. A fully-charged battery is provided. The battery has a CCAP and the CCAP is stored as state-of-charge (SOC) of the battery in an associated memory. A discharging current (i) drawn from the battery is measured with a current meter (i.e., ammeter) operatively connected to the load circuit. If i is less than or approximately equal I, then an effective discharging current ($i_{eff}$) is set equal to i; otherwise, $i_{eff}$ is set equal to $K \cdot i^P$. Both K and P are Peukert constants which may be experimentally defined by changes of CCAP of the battery in depletion tests in relation to changes of i to satisfy the Peukert Equation. SOC is decremented based on $i_{eff}$ while discharging the battery.

By another of the preferred methods of the invention, the method is also used for an electrical load circuit driven by an operatively connected battery. The battery has an experimentally defined CCAP substantially based on a depletion test, wherein such battery in a fully-charged condition is depleted over a depletion time period (T) while drawing a predefined discharging current (I) from such battery. A fully-charged battery is provided. The battery has a state-of-charge (SOC) which is set equal to CCAP and stored in an associated memory. In this preferred method, a value for an adjusted charge capacity ($CCAP_{adj}$) is generated. The $CCAP_{adj}$ is substantially based upon one form of the Peukert equation:

$$CCAP_{adj} = T \cdot I^P \quad [1]$$

The character P is a Peukert constant which is experimentally defined by an equation:

$$P = (\log T_2 - \log T_1) \div (\log I_1 - \log I_2) \quad [2]$$

In the equation, $T_1$ and $I_1$ are a period of time and discharging current respectively of a nominally first depletion test of the battery and $T_2$ and $I_2$ are a period of time and discharging current respectively of a nominally second depletion test of the battery such that $I_1$ is greater than $I_2$. Next, the value of $CCAP_{adj}$ is stored as an adjusted state-of-charge ($SOC_{adj}$) in a memory associated with $SOC_{adj}$. A discharging current (i) drawn from the battery is measured with a current meter and if i is less than or approximately equal to I, then an adjusted discharging current ($i_{adj}$) is set equal to $i \cdot I^{(P-1)}$; otherwise, $i_{adj}$ is set equal to $i^P$. The $SOC_{adj}$ is decremented based on $i_{adj}$ while the battery is being discharged.

In still another preferred embodiment of the invention, the method involves the use of a battery being charged by a battery charger. The battery is less than fully charged and has a CCAP. The battery also has the following: a) an adjusted charge capacity ($CCAP_{adj}$) which is satisfied by Equation 1; b) a state-of-charge (SOC); and c) an adjusted state-of-charge $SOC_{adj}$, wherein $SOC_{adj}$ is equal to SOC that has been adjusted to compensate for the Peukert Effect during discharging of the battery. The less-than-fully-charged battery is charged and charging current (z) is measured. An adjusted charging current ($z_{adj}$) is set equal to z and a value of a charging compensation factor (COMF) is produced.

Next, the value of $z_{adj}$ is modified in accordance with the following assignment: $z_{adj}=z_{adj} \cdot COMF \cdot CEF$. CEF is a defined charging efficiency factor of the battery. $SOC_{adj}$ is incremented based on $z_{adj}$ while charging the battery and portions of the method are repeated until $SOC_{adj}$ is substantially equal to $CCAP_{adj}$.

Furthermore, preferred apparatuses include memories for storing various discharging/charging related values and a processor to calculate and determine values related to accurately monitoring the battery's state-of-charge. Also, the preferred apparatuses and methods may also include ways of compensating for changing temperature conditions.

Moreover, an additional preferred embodiment of the invention includes a battery state-of-charge indicator for use with a battery state-of-charge monitor which is monitoring a battery, the indicator comprising a display having an array of illuminable elements for indicating the relative state-of-charge of the battery by: a) lighting a subset of the array of illuminable elements, wherein quantity of elements of the subset relative to quantity of elements of the array indicates the relative state-of-charge of the battery; b) lighting one or more elements of the subset in a condition-indicating color, wherein the color indicates the relative state-of-charge of the battery; and c) lighting one or more elements of the subset so that such elements exhibit a flashing pattern over a period of time, wherein the pattern further indicates the relative state-of-charge of the battery, and a controller operatively connected to the display and to the battery monitor, wherein the controller controls the display so that the subset is lighted so as to represent the relative state-of-charge of the battery.

These and other advantages and objects of the present invention will be more readily understood after consideration of the drawings and the detailed description of the preferred embodiment which follows.

DETAILED DESCRIPTION OF THE DRAWINGS AND BEST MODE FOR CARRYING OUT THE INVENTION

Figure 4A:
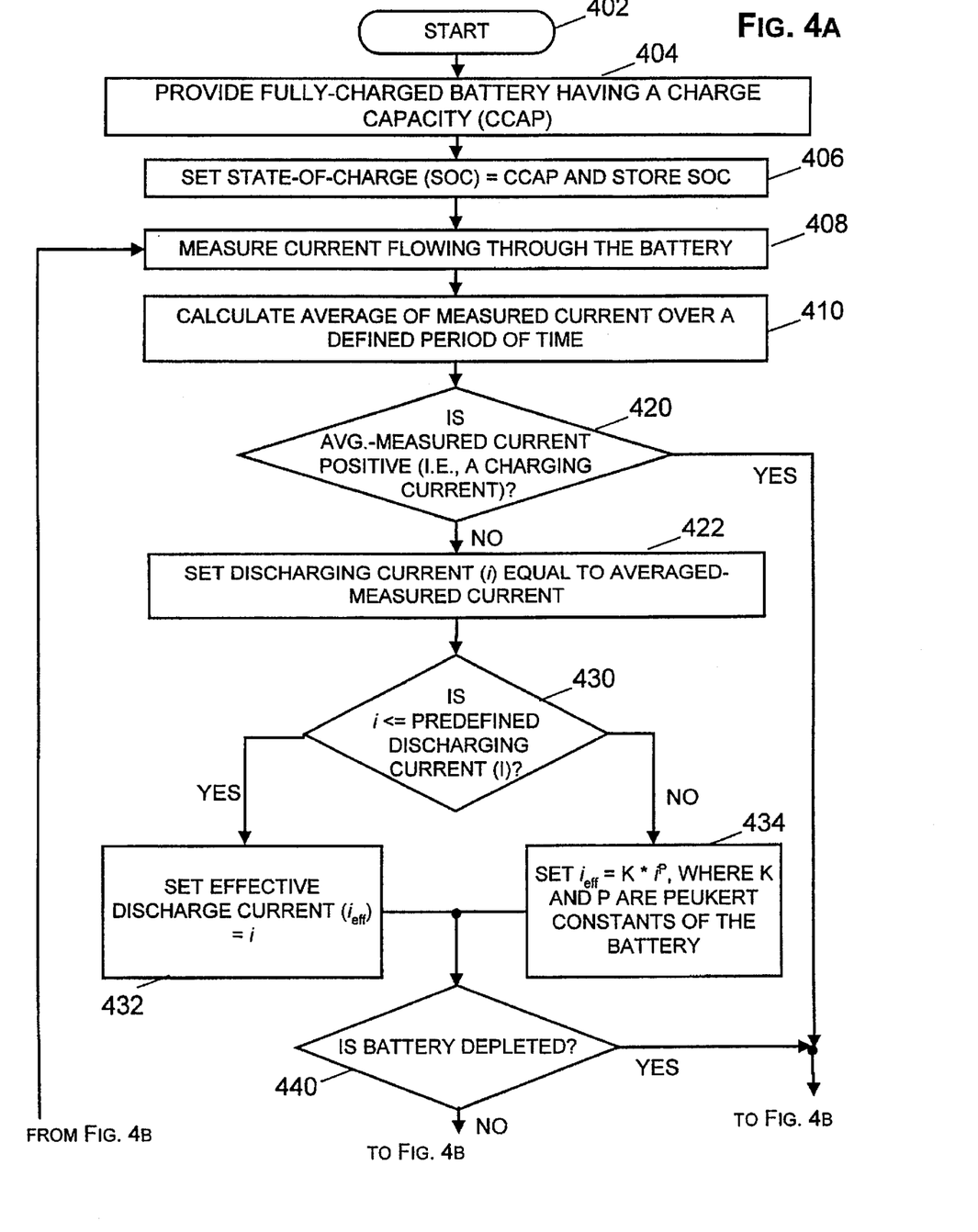
FIGS. 4A and 4B collectively are a high-level flowchart illustrating the first of three preferred methods of the invention by which the battery monitor operates.
Figure 4B:
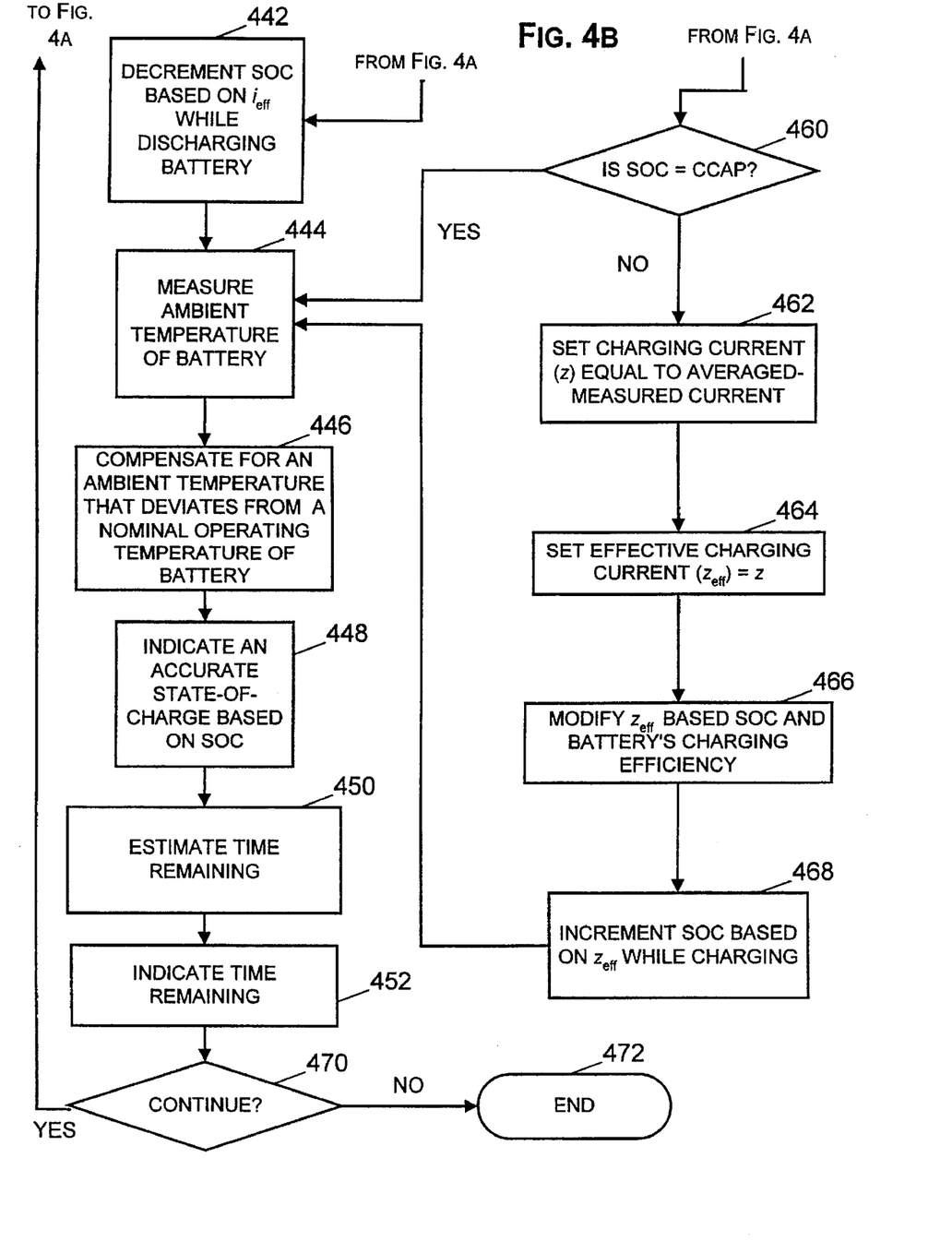
Figure 5A:
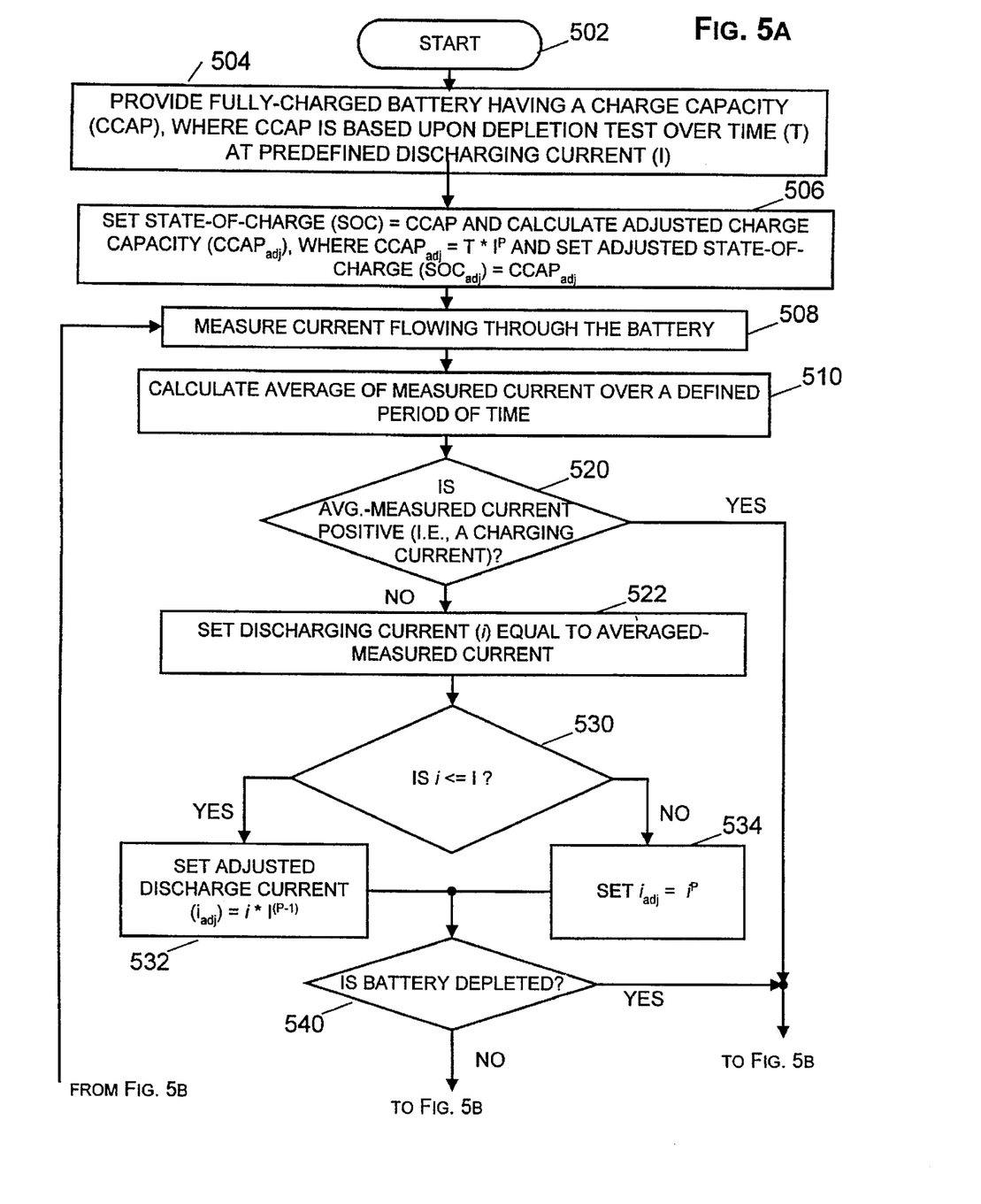
FIGS. 5A and 5B collectively are a high-level flowchart illustrating the second of three preferred methods of the invention by which the battery monitor operates.
Figure 5B:
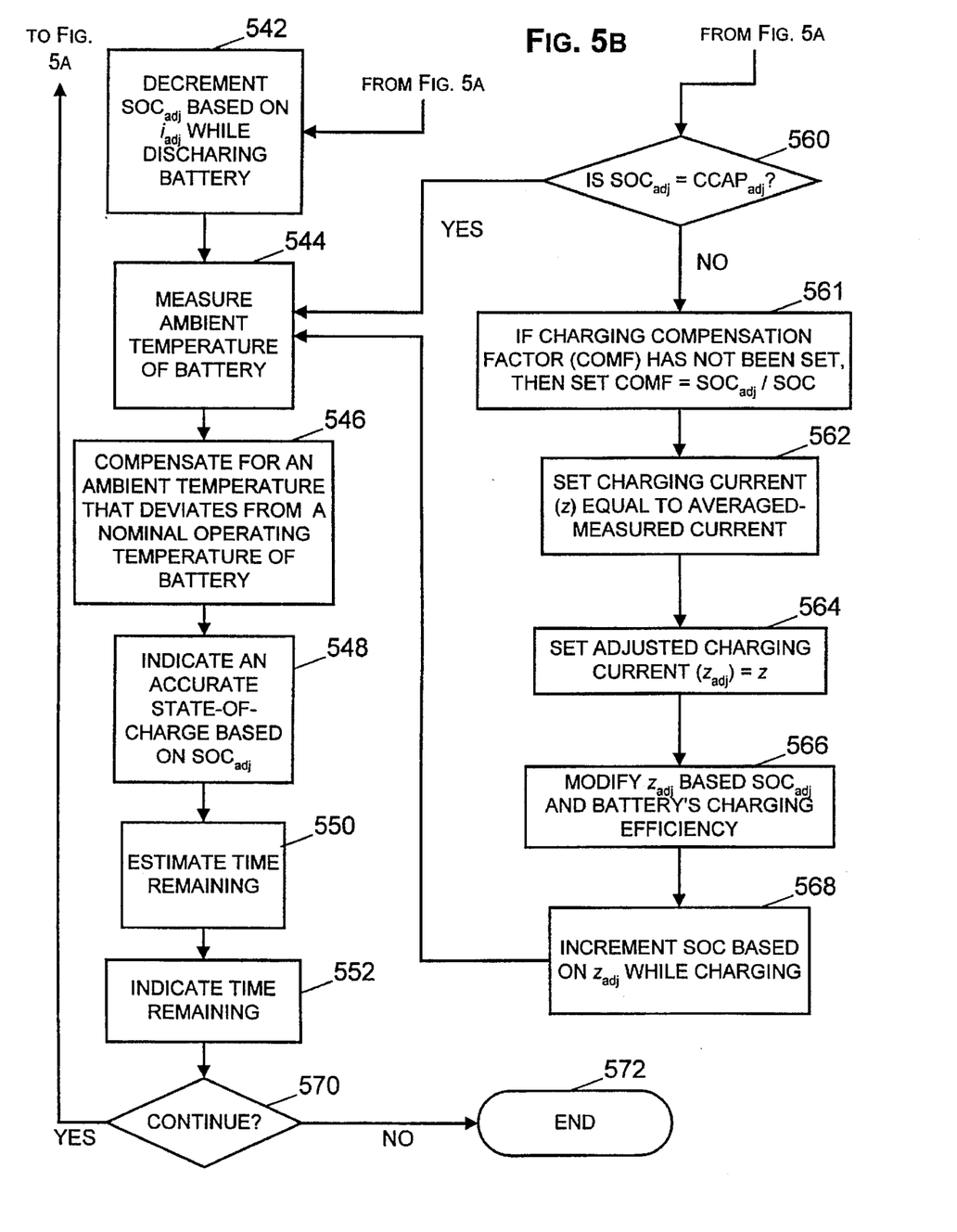
Figure 6:
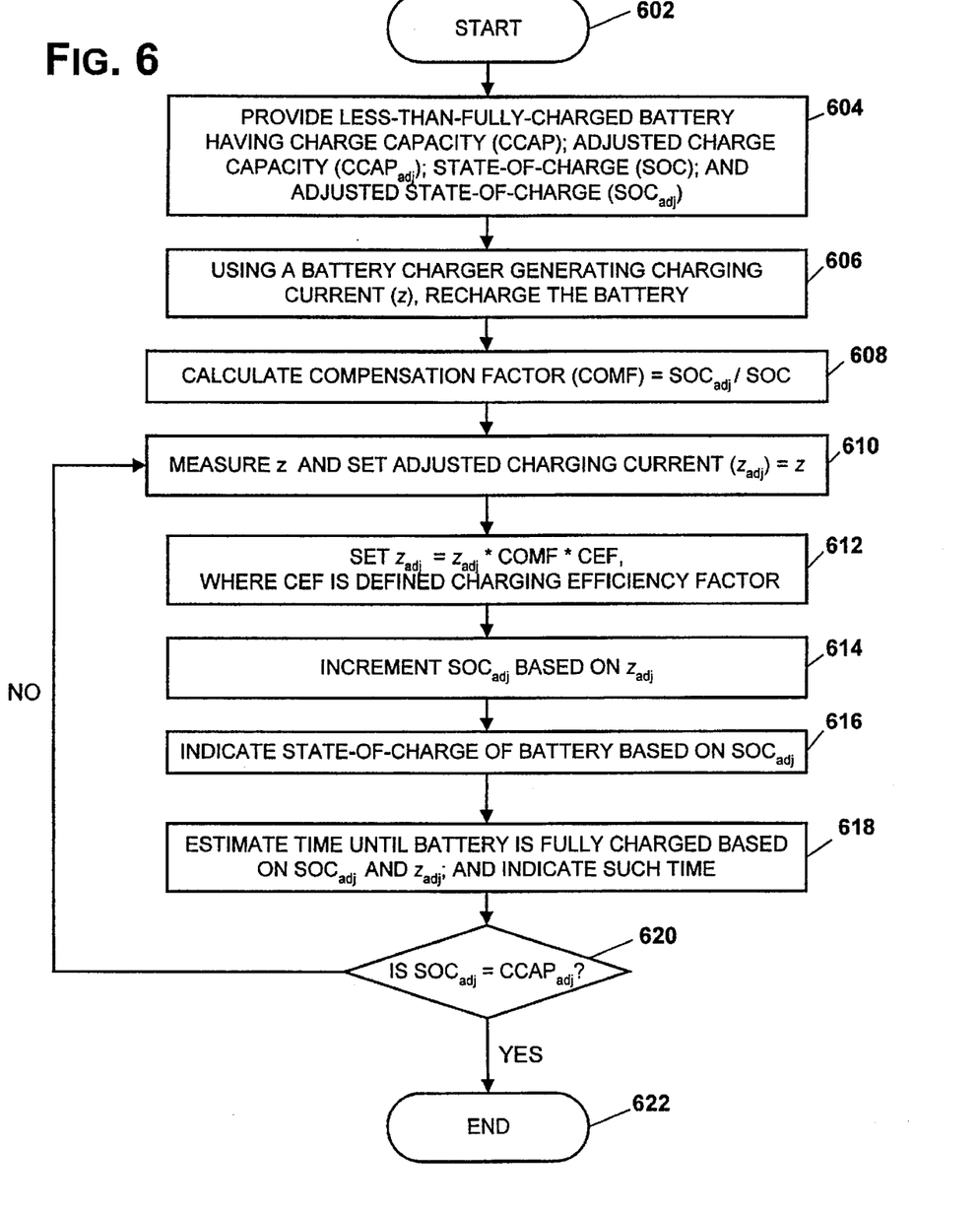
FIG. 6 is a high-level flowchart illustrating the third of three preferred methods of the invention by which the battery monitor operates.

The invented monitor/indicator, constructed in accordance with a preferred embodiment, is shown in FIGS. 1–3F. The invented monitoring/indicating process, performed in accordance with preferred methods, is shown in FIGS. 4–6.

In the field of battery monitoring of large-capacity batteries, the following are the typical units used: energy in kilowatts-hours (kWh); battery charge capacity (quantity of electricity) in Amp-hours (Ah); current in Amps (A); and electric potential in Volts (V). Those who are skilled in the art will understand and appreciate that although specific electrical terms and units are used herein, such terms and units may be converted into other equivalent terms and units.

Measured, calculated and defined terms provided herein are given labels to make them easier to use and understand. All single, italicized and lowercase characters (such as i or z) are labels for measured terms or averages of such measured terms. All single, non-italicized and uppercase characters (such as T and I) are lables for defined terms. However, such defined terms may have been originally measured or calculated, but such terms are not re-measured or recalculated during the preferred embodiments of the invented process or during the operation of the preferred embodiment of the invented apparatus. All multi-character, non-italicized, uppercase, acronymized terms are labels for variable terms (such as SOC and CCAP) that are calculated and potentially recalculated during the preferred embodiments of the invented process or during the operation of the preferred embodiment of the invented apparatus. Also, all terms may have subscripted modifiers, which indicates a different but related term.

Furthermore, symbols are used herein to indicate specific types of calculations and computations. The meaning of the symbols is defined as follows: a) addition is indicated by "+"; b) subtraction is indicated by "−"; c) equating is indicated by "="; d) multiplication may be indicated by "×", "∗" or "·"; d) division is indicated by "/" or "÷"; and the power of a term is indicated by a superscripted term to the right (such as $I^P$).

Preferably, the invented monitor/indicator is adapted for console mounting or retrofit within the control console of a recreational, marine vessel, electric vehicle and/or the wall of an alternative energy residence. The batteries described herein are rechargeable, large-capacity, deep-cycle batteries. However, those who are skilled in the art will understand that any type of battery may be used.

Batteries have a manufacturer-provided or user-determined charge capacity (CCAP). Regardless of its source, the charge capacity of a battery is experimentally determined by drawing a predefined discharging current (I) from a fully-charged battery and measuring how long it takes to completely discharge (i.e., deplete) the battery, which is the depletion time (T). The charge capacity is the current integrated over the depletion time. In other words, the charge capacity is defined by an equation:

$$CCAP = T \cdot I \qquad [3]$$

Typically, manufacturers base the battery's charge capacity on a discharging time of 20 hrs. Therefore, a typical 200 Ah battery discharges in twenty hours (hrs) with a discharge current of 10 A at a nominal operating temperature.

It appears that, given the charge capacity (CCAP) of a battery and given a measured discharging current (i), a battery monitor may track the state-of-charge (SOC) of the battery over time (t) based on an equation:

$$SOC = CCAP - (i \cdot t) \qquad [4]$$

In fact, this equation does represent the behavior of an ideal battery. However, in reality, Equation 4 does not accurately represent the behavior of a real battery if the measured discharging current is greater than the predefined discharging current (i.e., i>I). Also, Equation 4 does not accurately represent the behavior of a real battery if the ambient temperature around the battery deviates from a nominal operating temperature (OPTEMP).

The actual charge capacity of a battery is affected by the current load applied to the battery and the ambient temperature around the battery. In 1897, a scientist named Peukert determined that the effective charge capacity of a battery varies depending on the load applied to such battery. For example, a battery having a 200 Ah rating will provide 10 A to a load for 20 hours. Without compensating for variable conditions, a 200 Ah battery should supply a 30 A load for approximately 6⅔ hours. However in reality, the charge capacity of the battery lasts approximately 5.1 hours because of the so-called Peukert Effect. Thus, the effective charge capacity of the battery was approximately 150 Ah. Intrinsic properties of a chemical battery cause the Peukert Effect.

The Peukert Effect of a battery may be experimentally determined. The manufacturer may determine the Peukert Effect and provide it to the user or a user of the battery may calculate it by performing battery depletion tests. Such an experiment includes at least two depletion tests. A nominally first depletion test is performed at a first defined discharging current ($I_1$) over a measured first depletion time ($T_1$). After the first test, a nominally second test is performed at a second defined discharging current ($I_2$) over a measured second depletion time ($T_2$). $I_1$ and $I_2$ should be different in order to obtain meaningful results from the tests. Also, the chronological order of the test is not relevant to the results. The nominally first and nominally second tests are simply labeled first and second (as indicated by the term "nominally") and do not signify an order. Preferably, the first depletion test is at a relatively high discharging current and the second depletion test is at a relatively low discharging current so that the high and low currents bracket the user's expected range of operation.

However, the Peukert Effect is greatly reduced or non-existent when the discharging current is at or below the predefined discharge current (I) which was used to calculate the battery's original charge capacity (CCAP). Therefore, when monitoring the state-of-charge of a battery the Peukert Effect should not be considered if the discharging current is at or below the predefined discharge current (i.e., if $i \leq I$).

The charge capacity of the battery may be adjusted to compensate for the Peukert Effect. The adjusted charge capacity ($CCAP_{adj}$) may be defined by Equation 1. In the equation, T is the depletion time of a depletion test, I is the predefined current at which the depletion test is performed and P is called a Peukert constant. Peukert constant P is defined by Equation 2. In Equation 2, $T_1$ and $I_1$ are the depletion time and discharging current respectively of the nominally first depletion test and $T_1$ and $I_1$ are the depletion time and discharging current respectively the nominally second depletion test of the battery. $I_1$ should be greater than $I_2$ and the chronological order in which the depletion tests are performed is irrelevant. Equation 1 is one form of the so-called Peukert Equation.

With the Peukert Equation, an adjusted battery capacity ($CCAP_{adj}$) may be calculated and the actual state-of-charge of the battery may be tracked by decrementing the battery's state-of-charge over time based on an adjusted discharging current ($i_{adj}$), which has been adjusted to compensate for the Peukert Effect. The adjusted current is defined by an equation:

$$i_{adj}=i^P \quad [5]$$

Again, P is a Peukert constant and i is the measured discharging current.

An alternative representation in form of the Peukert Equation is:

$$CCAP=K \div (i^{(P-1)}) \quad [6]$$

In this alternative representation, K, like P, is an experimentally defined constant. Both K and P are defined by changes in the actual charge capacity of the battery in two (or more) depletion tests in relation to corresponding changes of the discharging current (i) which satisfies the Peukert Effect as represented by the Peukert Equation. Utilizing this alternative representation, an alternative process may be used to track the actual state-of-charge. Rather than adjusting two values (the charge capacity and the discharging current), one value can be calculated. Specifically, an effective discharging current ($i_{eff}$) can be used to decrement the state-of-charge of the battery. The effective discharging current is described by the equation:

$$i_{eff}=K \cdot i^P \quad [7]$$

Now that the general principles of the Peukert Effect have been described, the reader's attention is directed to FIGS. 1–3F as the preferred embodiment of the invented monitor/indicator as described. Although arrows are provided to indicate the directional flow of current and/or information, it is understood that such arrows do not limit the apparatus to such directional flows.

Figure 1:
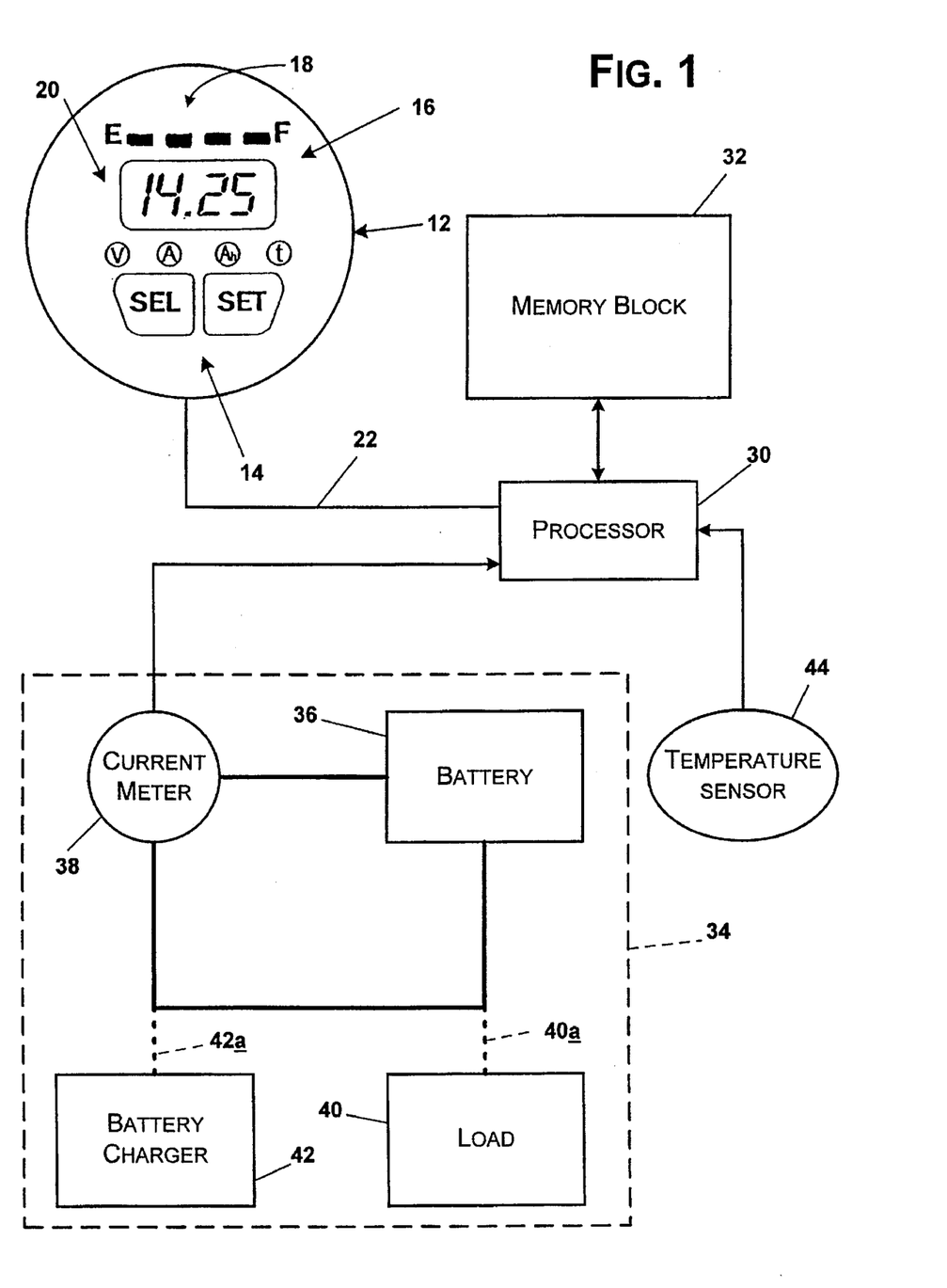
FIG. 1 is a system block diagram of the invented apparatus constructed in accordance with a preferred embodiment of the invention.

The monitor/indicator preferably includes a housing or enclosure with a flat input/output panel, represented by panel 12 in FIG. 1. The panel preferably has one or more push-button switches, such as those generally indicated at 14, in the form of a molded keypad. Using switches 14 the user may set and select various settings and parameters. Also, the panel has a status display 16 such as an alphanumeric liquid crystal display (LCD) 20 and a graphical, multi-segmented, multi-colored, multi-state, state-of-charge battery display 18. The graphical display preferably is an array of light-emitting diodes (LEDs). Those skilled in the art will appreciate that status display 16 may take any of a variety of shapes, sizes and configurations, within the spirit and scope of the invention.

Inside the housing is electronic circuitry including, as shown in FIG. 1, a processor 30 and a memory block 32. Processor 30 is operatively connected to the components of the panel via input/output connection 22. In particular, the processor is operatively connected to status display 16. The processor controls the various monitoring and indicating functions of the monitor/indicator. Operatively connected to the processor is memory block 32. The memory block includes various accessible memories. For example, memory block 32 may include: a state-of-charge memory for storing state-of-charge (SOC) of the battery; a baseline-current memory for storing the value of predefined discharging current (I); an effective-discharging-current memory for storing an effective discharging current ($i_{eff}$); an average-discharging-current memory for storing an average of i over a defined period of time; a nominal-operating-temperature memory for storing therein a predefined nominal operating temperature (OPTEMP) of the battery; an adjusted-charge-capacity memory for storing an adjusted charge capacity ($CCAP_{adj}$) of the battery; an adjusted-state-of-charge memory for storing an adjusted state-of-charge ($SOC_{adj}$); and an adjusted-discharging-current memory for storing an adjusted discharging current ($i_{adj}$).

The memory block preferably includes read-and-write memory (typically called random access memory (RAM)) and a read-only-memory (ROM). Preferably, processor 30 is a crystal oscillator-driven microcontroller, such as a 80C552 microprocessor. Additional circuitry which may be operatively connected to the processor include an address latch, a dip-switch array, and an input/output (I/O) port. The microprocessor executes instructions stored in the illustrated memory block (preferably in ROM) and performs all switch scanning and display functions, including driving the various LEDs and the LCD (which are part of status display 16). The microprocessor also is programmed to perform the monitoring and control functions described above, by suitable programming techniques.

FIG. 1 shows an electronic circuit within dashed-line box 34. Battery 36 and current meter (i.e., ammeter) 38 are included in the electronic circuit. The circuit may selectively include either current load 40 or battery charger 42. Such selective connection to the electronic circuit is indicated by dashed-lines 40a, 42a. When load 40 is connected to electronic circuit 34 it draws a discharging current (i) which may be measured by current meter 38. When battery 36 is being recharged, battery charger 42 is connected the electronic circuit and generates a charging current (z) which flows through battery 36. The charging current is measured by current meter 38. The current meter is operatively connected to processor 30 to provide the value of measured currents being drawn from or flowing through battery 36. Preferably, the meter includes a 500 amp/50 millivolt (50 mV) shunt.

FIG. 1 also shows a temperature sensor 44 located adjacent to battery 36 and operatively connected to processor 30. The temperature sensor measures the ambient temperature around battery 36 and sends the appropriate signals to processor 30 indicating such temperature.

When initializing the battery with the invented monitor, the user and/or the monitor sets and/or calculates various parameters. For example, such parameters may include: 1) an experimentally defined charge capacity (CCAP) of the battery; 2) predefined (or baseline) discharging current (I) at which CCAP was experimentally determined; 3) period of time (T) it took to deplete the battery when experimentally determining CCAP; and 4) a defined charging efficiency factor (CEF) of the battery.

Figure 2:
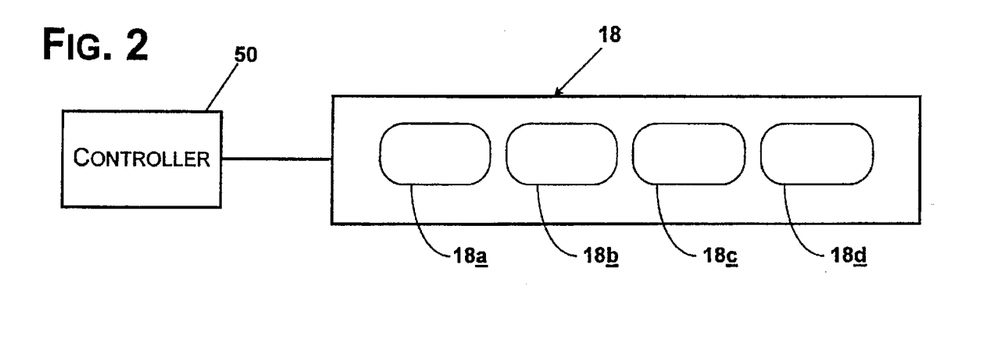
FIG. 2 is a simple block of a state-of-charge indicator which may be connected to the system illustrated in FIG. 1.

FIG. 2 shows a battery state-of-charge visual indicator. Such indicator includes a controller 50 operatively connected to graphical display 18. The controller and processor may be the same entity (e.g., the same microcontroller) or they may be separate entities which are operatively connected together. In either case, the controller is connected to portions of the monitor and receives information related to the state-of-charge of the battery. The controller drives graphical display 18. The display has an array of illuminable elements. Preferably, the array includes four elements 18a, 18b, 18c, 18d. Each element in the array may be lit in one of several colors and may flash on-and-off. A subset of the array may be lit to indicate the relative state-of-charge of the battery. A subset of the array is any number of elements from zero to all of the elements in the array. In the preferred embodiment, a subset can be any group from zero to four, inclusive. Also, the elements may be different colors, wherein each color indicates a relative state-of-charge of the battery. Preferably, three or four colors are shown: 1) green indicating a high state-of-charge (approximately over sixty percent of capacity); 2) yellow or orange indicating an intermediate state-of-charge (approximately between thirty-sixty percent); and red indicating a low state-of-charge (less than thirty percent). Furthermore, one or more elements may flash to further indicate the relative state-of-charge of the battery. Preferably, a flashing green light indicates that the battery is fully charged and a flashing red light indicates that the battery is near depleted (less than twenty percent).

Figure 3A:
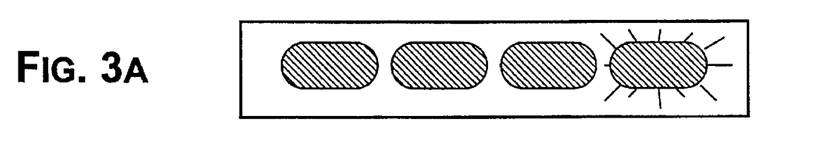
FIG. 3A-3F collectively illustrate various conditions of a lit display of the indicator of FIG. 2, wherein the display of FIG. 3A indicates a fully charged battery, the display of FIG. 3F indicates a depleted or nearly depleted battery and FIGS. 3B-3E indicates conditions therebetween.
Figure 3B:
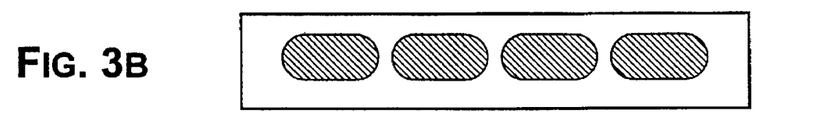
Figure 3C:
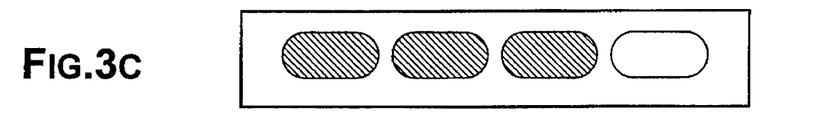
Figure 3D:
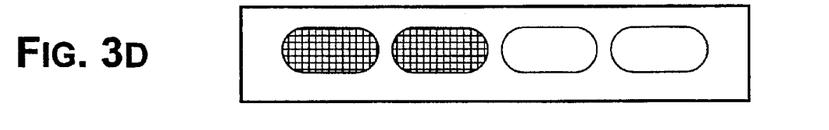
Figure 3E:
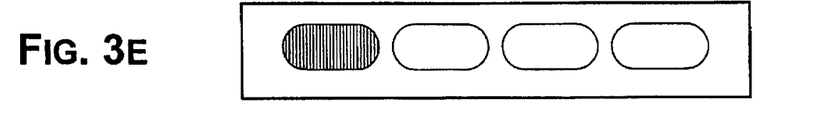
Figure 3F:
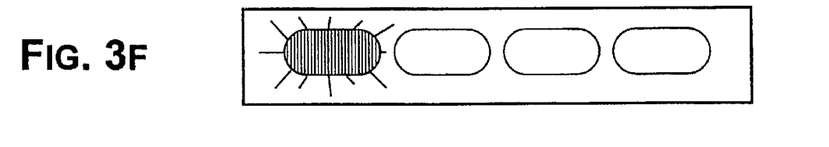

FIGS. 3A–3F show the six modes of the preferred embodiment of the state-of-charge indicator. The elements are shown in one of three states: 1) not-lit (i.e., off); 2) lit a specific color; or 3) lit and flashing. The lit colors are represented herein by hatching and cross-hatching. FIG. 3A shows all elements of the array lit in the color green with the right-most element flashing (as represented by diverging lines radiating from the element). This indicates a fully charged battery. FIG. 3B again shows all elements of the array lit in the color green, but none of the elements is not flashing. This indicates a nearly fully-charged battery (approximately eighty to ninety-nine percent). For the indicator shown in FIGS. 3A and 3B, the subset of lit elements is equal to the entire set of the array, specifically four. FIG. 3C shows only three of the four elements lit and those that are lit are lit in the color green; thus, the subset is three. This indicates that state-of-charge is high, but relatively less than before (approximately between sixty and seventy-nine percent). FIG. 3D shows only half of the elements lit and both are lit in the color yellow (or orange or amber); thus, the subset is two. This indicates that state-of-charge is at a lower level and the user should consider recharging the battery (approximately between forty and fifty-nine percent). FIG. 3E shows only one of the elements lit and that one is lit in the color red; thus, the subset is one. This indicates that state-of-charge is low and the user should seek an opportunity to recharge the battery (approximately between twenty and thirty-nine percent). FIG. 3F shows only one of the elements lit and that one is flashing red. This indicates that the battery is near depletion and it must recharged immediately to avoid damaging the battery from excessive discharge (approximately less than twenty percent).

As shown in FIGS. 2–3F, the display has an array of illuminable elements, such as 18a–18d of FIG. 2, for indicating the relative state-of-charge of the battery by: a) lighting a subset of the array of illuminable elements, wherein quantity of elements of the subset relative to quantity of elements of the array indicates the relative state-of-charge of the battery; b) lighting one or more elements of the subset in a condition-indicating color, wherein the color indicates the relative state-of-charge of the battery; and c) lighting one or more elements of the subset so that such elements exhibit a flashing pattern over a period of time, wherein the pattern further indicates the relative state-of-charge of the battery.

FIGS. 4A–6 illustrate the three preferred methods of accurately monitoring the state-of-charge of a battery. The first of the three preferred methods is shown in the flowchart of FIGS. 4A and 4B. The method starts at 402. At 404, a fully-charged battery having a charge capacity (CCAP) is provided. CCAP is experimentally defined by performing a depletion test at a predefined discharging current (I). Either the manufacturer of the battery or the user may determine the battery's capacity. At 406, a present state-of-charge (SOC) of the battery is set equal to CCAP and SOC is stored in an associated memory. Next at 408, a current which is flowing through the battery is measured with a current meter. As indicated at 410, the current, preferably is averaged over a defined current-averaging period of time. In the preferred embodiments and methods, the user may select any time period, but the default current-averaging period of time is four minutes. This means that at any point in time, an apparatus made in accordance with the invention keeps an average of the current over the previous four minutes. The advantage of averaging the current over using instantaneous measurements is to avoid sudden peaks and valleys in the current which may skew the indicated state-of-charge. Averaging reduces the affect of skew-producing current measurements.

At 420 in FIG. 4A, it is determined whether the averaged-measured current is positive. If so, this indicates the battery is now being charged and the process should skip to decision block 460 on FIG. 4B where the charging portion of the process begins. If the averaged-measured current is not positive, then the process proceeds to block 422 where a discharging current (i) is set equal to the averaged-measured current. The discharging portion of the process begins at 422.

At 430 in FIG. 4A, it is determined whether i is equal to or less than the predefined discharging current (I). As discussed above, the current used to determine CCAP of the battery was I. If i is less than or equal to I, then the Peukert Effect may diverge from reality, thus the Peukert Effect should be ignored and the method proceed to process block 432, where an effective discharging current ($i_{eff}$) is set equal to the actual measured (or average of the measured) discharging current. If i is greater than I, then the method proceeds to block 434 where $i_{eff}$ is set equal to $K \cdot i^P$, in accordance with Equation 7 above. As noted above in the general discussion of the Peukert Effect and Equation, K and P are Peukert constants which may be experimentally defined. In general, both K and P are defined by changes in the actual charge capacity of the battery in two (or more) depletion tests in relation to corresponding changes of the discharging current (i) which satisfies the Peukert Effect as represented by the Peukert Equation, in accordance with Equations 1 and 7. The process proceeds to block 440 regardless of the outcome of the determining step at 430.

At 440 in FIG. 4A, it is determined whether the battery is depleted. If so then the process proceeds to decision block 460 which is the beginning of the charging portion of the process. If the battery is not depleted, then the process proceeds to block 442 on FIG. 4B where the SOC is decremended based on $i_{eff}$ while discharging the battery. Thus, the accurate state-of-charge of the battery is tracked by using an effective discharging current which will be higher than i if i is greater than I.

At 444, the ambient temperature around the battery is measured and at 446 compensation is made for an ambient temperature deviating from a nominal operating temperature (OPTEMP) of the battery. Temperature is another factor that may affect the charge capacity of the battery. A typical 200 Ah battery is rated to operate at approximately twenty degrees celsius (20° C,). This means that the battery can provide 10 A for 20 hrs at 20° C. Thus, the nominal operating temperature (OPTEMP) of the battery is 20° C. However, the actual capacity of the battery will increase if ambient temperature is greater than OPTEMP and will decrease if ambient temperature is less than OPTEMP. A user may select any temperature, but preferably the temperature selected is the same as prevailed temperature when the depletion test was performed to determine CCAP of the battery.

At 448, an accurate state-of-charge of the battery may be indicated, wherein such indication is based on the present SOC. Such indication may be via status display 16. Based on the present SOC, the time remaining until the battery is substantially depleted is estimated at 450 and so indicated at 452.

At 470, it is determined whether the user chooses to continue. If not, then the process ends at 472. Assuming so, the process returns to 408 to measure the current.

At 460, the process enters the recharging phase if SOC is not equal to CCAP. At 462, a charging current (z) is set equal to averaged-measured current. At 464, an effective charging current ($z_{eff}$) is set equal to z. At 466, $z_{eff}$ is modified based on present SOC and based on the battery's defined charging efficiency. At 468, the stored SOC is incremented based on the value of $z_{eff}$ over time while the battery is being charged. Thus, the accurate state-of-charge of the battery is tracked by using only an effective charging current which most likely will be higher than z because of the Peukert Effect, but the effective charging current will be tempered by the battery's inherent charging efficiency. After incrementing SOC, the process goes to block 444, where ambient temperature is measured. The process continues through 470 where it may end or loop back to measuring current at 408.

A second preferred method of accurately monitoring the state-of-charge of a battery is shown in the flowchart of FIGS. 5A and 5B. The method starts at 502. At 504, a fully-charged battery having a CCAP is provided. As previously described, CCAP is experimentally defined by performing a depletion test at a predefined discharging current (I) over a depletion period of time (T). At 506, a present state-of-charge (SOC) of the battery is set equal to CCAP and SOC is stored in an associated memory and a value of an adjusted charge capacity ($CCAP_{adj}$) is generated and an adjusted state-of-charge ($SOC_{adj}$) is set equal to $CCAP_{adj}$. The $CCAP_{adj}$ represents the charge capacity of the battery which has been adjusted or modified to compensate for the Peukert Effect. When a similarly adjusted discharge current is used to decrement $SOC_{adj}$ over time, $SOC_{adj}$ will accurately represent the relative state-of-charge of the battery. $CCAP_{adj}$ is defined by Equation 1.

Next at 508, a current which is flowing through the battery is measured with a current meter (i.e., ammeter). As indicated at 510, the current, preferably is averaged over a defined current-averaging period of time.

At 520 in FIG. 5A, it is determined whether the averaged-measured current is positive. If so, this indicates the battery is now being charged and the process should skip to decision block 560 on FIG. 5B where the charging portion of the process begins. If the averaged-measured current is not positive, then the process proceeds to block 522 where a discharging current (i) is set equal to the averaged-measured current. The discharging portion of the process begins at 522.

At 530, it is determined whether i is equal to or less than the predefined discharging current (I). If it is less than or equal to I, then the Peukert Effect may diverge from reality, thus Peukert Effect should not be factored into the state-of-charge determinations. However, since $SOC_{adj}$ was already adjusted based on the Peukert Effect, the current used in decrementing the adjusted state-of-charge should be normalized to account for the already altered state-of-charge. Thus, at 532, an adjusted discharging current ($i_{adj}$) is normalized based on an equation:

$$i_{adj} = i \cdot I^{(P-1)} \qquad [8]$$

The normalization factor of $I^{(P-1)}$ is equal to $CCAP_{adj} \div CCAP$ and can be derived from Equations 1 and 3. If i is greater than I, then the method proceeds to block 534 where $i_{adj}$ is set equal to $i^P$. Thus, the current is adjusted to compensate for the Peukert Effect. The process proceeds to block 540 regardless of the outcome of the determining step at 530.

At 540 in FIG. 4A, it is determined whether the battery is depleted. If so then the process proceeds to decision block 560 which is the beginning of the charging portion of the process. If the battery is not depleted, then the process proceeds to block 542 on FIG. 5B where the $SOC_{adj}$ is decremended based on $i_{eff}$ while discharging the battery. Thus, the accurate state-of-charge of the battery is tracked by using an effective discharging current which will be higher than i if i is greater than I.

At 544, the ambient temperature around the battery is measured and at 446 $CCAP_{adj}$ is modified to compensate for an ambient temperature deviating from a nominal operating temperature (OPTEMP) of the battery. Such modification preferably includes finding a $\Delta T$ which is the difference between the OPTEMP and the ambient temperature (AT). In other words, $\Delta T$ is defined by the equation:

$$\Delta T = OPTEMP - AT \qquad [9]$$

The temperature modification also includes a $\Delta T$-adjustment constant ($\alpha$), wherein $\alpha$ may be experimentally defined by an equation:

$$\alpha = CCAP_1 \div CCAP_2 \qquad [10]$$

In this equation, $CCAP_1$ is charge capacity of the battery of a first depletion test of the battery at a first temperature and $CCAP_2$ is charge capacity of the battery of a second depletion test of the battery at a second temperature, where $CCAP_2$ is greater than $CCAP_1$. Also, included is a determination of a temperature correction factor (TCF), which is defined by an equation:

$$TCF = \alpha \cdot \Delta T \qquad [11]$$

Finally, the modification includes factoring TCF into $SOC_{adi}$ so that the value of $SOC_{adj}$ is set with the instruction: $SOC_{adj} = SOC_{adj} + (TCF \cdot SOC_{adj})$.

At 542 of FIG. 5B, the stored $SOC_{adj}$ is decremented based on the value of $i_{adj}$ over time while the battery is being discharged. Thus, the accurate state-of-charge of the battery is tracked by using the adjusted discharging current and the adjusted state-of-charge. At 548, an accurate state-of-charge of the battery my be indicated, wherein such indication is based on the present $SOC_{adj}$. Based on the present $SOC_{adj}$, the time remaining until the battery is substantially depleted is estimated at 550 and so indicated at 552. Also, the normal state-of-charge (SOC) may be decremented based on i, but it is not used to indicate the actual state-of-charge.

At 570, it is determined whether user wishes to continue. If not, then the process ends at 572. Assuming so, the process returns to 508 to measure the current.

At 562, a charging current (z) is set equal to averaged-measured current. At 564, an adjusted charging current ($z_{adj}$) is set equal to z. At 561, a charging compensation factor (COMF) is produced. This factor is related to the ratio of the adjusted state-of-charge to the present unadjusted (normal) state-of-charge. Such COMF is defined by an equation:

$$COMF = SOC_{adj} \div SOC \qquad [12]$$

At 566, $z_{adj}$ is modified based on present COMF and based on charging efficiency factor (CEF). The CEF represents the charging efficiency of the battery and charger system. The user may input or the monitor may calculate the charging efficiency factor (CEF) of the battery charging system and battery. Also, a new CEF may be recalculated each time the battery is recharged.

At 568, the stored $SOC_{adj}$ is incremented based on the value of $z_{adj}$ over time while the battery is being charged. From 568, the process goes to 544 where temperature is measured. From there, the process proceeds until 570 where it may end at 572 if the user chooses not to continue. Otherwise, it loops back to 508.

A third preferred method of accurately monitoring the state-of-charge of a battery is shown in the flowchart of FIG. 6. The method is particularly directed toward recharging a battery and starts at 602. At 604, a less-than-fully-charged battery is provided where such battery has a CCAP, $CCAP_{adj}$, SOC and $SOC_{adj}$. At 606, a battery charger charges the battery with a charging current (z). At 608, a charging compensation factor (COMF) is calculated. This same COMF described above relative to block 546. At 610, z is measured and an adjusted charging current ($z_{adj}$) is set equal to z. At 612, $z_{adj}$ is set based on present COMF and based on charging efficiency factor (CEF). At 614, the stored $SOC_{adj}$ is incremented based on the value of $z_{adj}$ over time while the battery is being charged. At 616 and 618, the state-of-charge of the battery and the estimated time remaining until fully charged are indicated. At 620, the process determines whether the battery is now fully charged based on $SOC_{adj}$ being substantially equal to $CCAP_{adj}$. If not yet fully charged, then the process return to the measuring step of block 610. If the battery is fully charged, then the process ends at 622.

Those who are skilled in the art will appreciate and understand that the state-of-charge of the battery and the time remaining until the battery is either depleted or fully charged may be indicated at any time during the invented methods. Thus, the indicating steps shows in the above described preferred processes may take place at any point in the process.

While the present invention has been shown and described with reference to the foregoing preferred methods and embodiment, it will be apparent to those skilled in the art that other changes in form and detail may be made therein without departing from the spirit and scope of the invention as defined in the appended claims.

Industrial Applicability

The invented battery state-of-charge monitoring/indicating method and apparatus now may be understood to provide an accurate state-of-charge of the monitored battery, because conditions affecting the capacity of the battery are compensated for.

While the preferred embodiment and best mode of the invention have been disclosed, variations and changes may be made without departing from the spirit and scope of the invention.

We claim:

1. For an electrical load circuit driven by an operatively connected battery, wherein such battery has an experimentally defined charge capacity (CCAP) substantially based on a predefined discharging current (I) during a depletion test of the battery, a method of monitoring an accurate state-of-charge of a battery comprising;

storing CCAP as state-of-charge (SOC) of the battery in an associated memory;

measuring a discharging current (i) drawn from the battery;

determining if i is less than or approximately equal to I;

if so, then setting an effective discharging current ($i_{eff}$)

equal to i; otherwise setting $i_{eff}$ equal to $K \cdot i^P$, wherein K and P are Peukert constants being experimentally defined by changes of CCAP of the battery in depletion tests in relation to changes of i to satisfy Peukert Equation; and decrementing SOC based on $i_{eff}$ while discharging the battery.

2. The method of claim 1 further comprising repeating said measuring, said determining and said decrementing steps until the battery is substantially depleted.

3. The method of claim 1 further comprising indicating an accurate state-of-charge of the battery based on SOC in said decrementing step.

4. The method of claim 1 further comprising estimating time remaining until the battery is substantially depleted based on SOC in said decrementing step and based on $i_{eff}$, and indicating the time remaining.

5. A method as in one of claims 1–4 further comprising:

averaging i over a defined current-averaging period of time to produce an average discharging current, and setting i equal to the average discharging current.

6. A method as in one of claim 1–4, in which a temperature sensor is located adjacent the battery, further comprising:

providing and storing in an associated memory a nominal operating temperature (OPTEMP) of the battery;

measuring ambient temperature adjacent the battery with the sensor; and compensating for an ambient temperature which deviates from OPTEMP.

7. A method as in one of claims 1–4, in which a battery charger is operatively connected to the battery, further comprising:

providing and storing a predefined charging efficiency of the battery;

storing CCAP in an associated memory;

repeating said measuring, said determining and said decrementing steps;

charging the battery with the battery charger by causing a charging current (z) to flow through the battery;

measuring z with a current meter operatively connected to the battery and setting an effective charging current ($z_{eff}$) equal to z;

modifying $z_{eff}$ based on SOC of the battery and reducing $z_{eff}$ relative to the charging efficiency of the battery;

incrementing SOC based on $z_{eff}$ while charging the battery; and repeating said measuring, said calculating and said incrementing steps until SOC is substantially equal to CCAP.

8. For an electrical load circuit driven by an operatively connected battery, wherein such battery has an experimentally defined charge capacity (CCAP) which is substantially based upon a depletion test, wherein such battery in a fully-charged condition is depleted over a depletion time period (T) while drawing a predefined discharging current (I) from such battery, a method of monitoring an accurate state-of-charge of a battery comprising:

storing CCAP as state-of-charge (SOC) of the battery in an associated memory;

generating a value of an adjusted charge capacity ($CCAP_{adj}$) substantially based upon an equation $CCAP_{adj} = T \cdot I^P$, wherein P is a Peukert constant which is experimentally defined by an equation $P = (\log T_2 - \log T_1) \div (\log I_1 - \log I_2)$, wherein $T_1$ and $I_1$ are a period of time and discharging current respectively of a nominally first depletion test of the battery and $T_2$ and $I_2$ are a period of time and discharging current respectively of a nominally second depletion test of the battery such that $I_1$ is greater than $I_2$;

storing value of $CCAP_{adj}$ as an adjusted state-of-charge ($SOC_{adj}$ in a memory associated with $SOC_{adj}$;

measuring a discharging current (i) drawn from the battery determining if i is less than or approximately equal to I; if so, then setting an adjusted discharging current ($i_{adj}$) equal to $i \cdot I^{(P-1)}$; otherwise, setting $i_{adj}$ equal to $i^P$; and decrementing $SOC_{adj}$ based on $i_{adj}$ while discharging the battery.

9. The method of claim 8 further comprising repeating said measuring, said determining and said decrementing steps until the battery is substantially depleted.

10. The method of claim 8 further comprising indicating an accurate state-of-charge of the battery substantially based on $SOC_{adj}$.

11. The method of claim 8 further comprising estimating time remaining until the battery is substantially depleted based on $SOC_{adj}$ and on $i_{adj}$, and indicating the time remaining.

12. A method as in one of claims 8–11 further comprising:

averaging i over a defined current-averaging period of time to produce an average discharging current, and setting i equal to the average discharging current.

13. A method as in one of claims 8–11, in which a temperature sensor is located adjacent the battery, further comprising:

providing, and storing in an associated memory, a nominal operating temperature (OPTEMP) of the battery;

measuring ambient temperature adjacent the battery with the sensor; and compensating $CCAP_{adj}$ for temperature deviations of the measured ambient temperature from OPTEMP.

14. A method as in one of claims 8–11, in which a battery charger is operatively connected to the battery, further comprising:

providing and storing in an associated memory a predefined charging efficiency of the battery;

storing $CCAP_{adj}$ in an associated memory;

repeating said measuring, said determining and said decrementing steps;

charging the battery with the battery charger by causing a charging current (z) to flow through the battery;

measuring z and setting an adjusted charging current ($z_{adj}$) equal to z;

modifying $z_{adj}$ based on $SOC_{adj}$ of the battery and reducing $z_{adj}$ relative to the charging efficiency of the battery;

incrementing $SOC_{adj}$ based on $z_{adj}$ while charging the battery; and repeating said measuring, said generating, said defining and said incrementing steps until $SOC_{adj}$ is substantially equal to $CCAP_{adj}$.

15. A method as in one of claims 8–11, in which a battery charger is operatively connected to the battery, further comprising:

providing and storing in an associated memory a predefined charging efficiency factor (CEF) which represents charging efficiency of the battery;

storing $CCAP_{adj}$ in an associated memory;

decrementing SOC based on i while discharging battery;

repeating said measuring, said determining and said decrementing steps;

charging the battery with the battery charger by causing a charging current (z) to flow through the battery;

measuring z and setting an adjusted charging current ($z_{adj}$) equal to z;

producing a charging compensation factor (COMF) wherein COMF is defined by an equation COMF= $SOC_{adj} \div SOC$;

modifying $z_{adj}$ so that $z_{adj} = z_{adj} \cdot COMF \cdot CEF$;

incrementing $SOC_{adj}$ based on $z_{adj}$ while charging the battery; and repeating said measuring, said producing, said defining and said incrementing steps until $SOC_{adj}$ is substantially equal to $CCAP_{adj}$.

16. For a battery with a battery charger operatively connected thereto, wherein such battery has an experimentally defined charge capacity (CCAP) which is substantially based upon a depletion test, wherein such battery in a fully-charged condition is depleted over a depletion time period (T) while drawing a predefined discharging current (I) from such battery; a method of monitoring an accurate state-of-charge of a battery comprising:

providing a less-than-fully-charged battery, wherein the battery has: a) an adjusted charge capacity ($CCAP_{adj}$) which is satisfied by an equation $CCAP_{adj} = T \cdot I^P$, wherein P is a Peukert constant which is experimentally defined by an equation $P = (\log T_2 - \log T_1) \div (\log I_1 - \log I_2)$, wherein $T_1$ and $I_1$ are a period of time and discharging current respectively of a nominally first depletion test of the battery and $T_2$ and $I_2$ are a period of time and discharging current respectively of a nominally second depletion test of the battery such that $I_1$ is greater than $I_2$, which $CCAP_{adj}$ is stored in an associated memory; b) a state-of-charge (SOC) which is stored in an associated memory; and c) an adjusted state-of-charge $SOC_{adj}$ stored in an associated memory, wherein $SOC_{adj}$ is equal to SOC which has been adjusted to compensate for the Peukert Effect during discharging of the battery;

charging the less-than-fully-charged battery with the battery charger by causing a charging current (z) to flow through the battery;

measuring z and setting an adjusted charging current ($z_{adj}$) equal to z;

producing a charging compensation factor (COMF) wherein COMF is defined by an equation COMF= $SOC_{adj} \div SOC$;

modifying $z_{adj}$ so that $z_{adj} = z_{adj} \cdot COMF \cdot CEF$, wherein CEF is a defined charging efficiency factor of the battery;

incrementing $SOC_{adj}$ based on $z_{adj}$ while charging the battery.

17. the method of claim 16 further comprising repeating said charging, said measuring, said producing, said modifying and said incrementing steps until $SOC_{adj}$ is substantially equal to $CCAP_{adj}$.

18. The method of claim 16 further comprising indicating the state-of-charge of the battery based on $SOC_{adj}$.

19. The method of claim 16 further comprising estimating time remaining until the battery is substantially fully charged based on $SOC_{adj}$ and on $Z_{adj}$, and indicating the time remaining.

20. A method as in one of claims 16–19 further comprising:

averaging z over a defined current-averaging period of time to produce an average charging current, and setting z equal to the average charging current.

21. A method as in one of claims 16–19, in which a temperature sensor is located adjacent the battery, further comprising:

providing, and storing in an associated memory, a nominal operating temperature (OPTEMP) of the battery;

measuring ambient temperature adjacent the battery with the sensor; and compensating $CCAP_{adj}$ for temperature deviations of the measured ambient temperature from the OPTEMP.

22. An accurate battery state-of-charge monitor for an electrical load circuit driven by an operatively connected battery, wherein such battery has an experimentally defined charge capacity (CCAP) which is substantially based upon a depletion test of the battery at a predefined discharging current (I), the monitor comprising:

a state-of-charge memory for storing state-of-charge (SOC) of the battery therein, wherein when the battery is in a fully-charged condition, the value of CCAP is stored in the state-of-charge memory;

a baseline-current memory for storing the value of I therein;

an effective-discharging-current memory for storing an effective discharging current ($i_{eff}$);

a current meter operatively connected to the load circuit for measuring a discharging current (i) drawn from the battery; and a processor operatively connected to each of said memories and to said current meter, wherein the processor determines if i is less than or approximately equal to stored I; if so, then the value of i is stored as $i_{eff}$ in the effective-discharging-current memory; otherwise, the value of $K \cdot i^P$ is stored as $i_{eff}$ in the effective-discharging-current memory, wherein K and P are Peukert constants being experimentally defined by changes of charge capacity of the battery in depletion tests in relation to changes of i to satisfy Peukert Equation, and the processor decrements stored SOC based on stored $i_{eff}$ while battery is being discharged.

23. The monitor of claim 22 further comprising a state-of-charge indicator for indicating the accurate state-of-charge of the battery based on SOC, the state-of-charge indicator being operatively connected to the processor.

24. The monitor of claim 22 further comprising a time-remaining indicator for indicating time remaining until the battery is substantially depleted, wherein the processor calculates the time remaining based on SOC and on stored $i_{eff}$, and wherein the processor is operatively connected to the time-remaining indicator.

25. A monitor as in one of claims 22–24 further comprising an average-discharging-current memory for storing an average of i, wherein the processor averages i over a defined current-averaging period of time, sets i equal to the average discharging current and stores the average discharging current in the average-discharging-current memory.

26. A monitor as in one of claims 22–24, in which a temperature sensor is located adjacent the battery and is operatively connected to the processor, the sensor for measuring the ambient temperature adjacent the battery, further comprising a nominal-operating-temperature memory operatively connected to the processor, the nominal-operating-temperature memory for storing therein a predefined nominal operating temperature (OPTEMP) of the battery, wherein if a measured ambient temperature adjacent the battery deviates from stored OPTEMP, the processor modifies stored values to compensate for such temperature deviation.

27. An accurate battery state-of-charge monitor for an electrical load circuit driven by an operatively connected battery, wherein such battery has an experimentally defined charge capacity (CCAP) which is substantially based upon a depletion test, wherein such battery in a fully-charged condition is depleted over a depletion time period (T) while drawing a predefined discharging current (I) from such battery, the monitor comprising:

a state-of-charge memory for storing state-of-charge (SOC) of the battery, wherein when the battery is in a fully-charged condition, the value of CCAP is stored in the state-of-charge memory;

a baseline-current memory for storing the value of I therein;

an adjusted-charge-capacity memory for storing an adjusted charge capacity ($CCAP_{adj}$) of the battery, wherein $CCAP_{adj}$ is defined by an equation $CCAP_{adj}=T \cdot I^P$, wherein P is a Peukert constant which is experimentally defined by an equation $P=(\log T_2 - \log T_1) \div (\log I_1 - \log I_2)$, wherein $T_1$ and $I_1$ are a period of time and discharging current respectively of a nominally first depletion test of the battery and $T_2$ and $I_2$ are a period of time and discharging current respectively of a nominally second depletion test of the battery such that $I_1$ is greater than $I_2$;

an adjusted-state-of-charge memory for storing an adjusted state-of-charge ($SOC_{adj}$) of the battery, wherein when the battery is in a fully-charged condition, the value of $CCAP_{adj}$ is stored therein;

an adjusted-discharging-current memory for storing an adjusted discharging current ($i_{adj}$);

a current meter operatively connected to the load circuit for measuring a discharging current (i) drawn from the battery; and a processor operatively connected to each of said memories and to said current meter, wherein the processor determines if i is less than or approximately equal to I; if so, then the value of $i \cdot I^{(P-1)}$ is stored as $i_{adj}$ in the adjusted-discharging-current memory; otherwise, the value of $i^P$ is stored as $i_{adj}$ in the adjusted-discharging-current memory, and the processor decrements stored $SOC_{adj}$ based on stored $i_{adj}$ while battery is being discharged.

28. The monitor of claim 27 further comprising a state-of-charge indicator for indicating the accurate state-of-charge of the battery based on $SOC_{adj}$, the state-of-charge indicator being operatively connected to the processor.

29. The monitor of claim 27 further comprising a time-remaining indicator for indicating time remaining until the battery is substantially depleted, wherein the processor calculates the time remaining based on $SOC_{adj}$ and on $i_{adj}$ and wherein the processor is operatively connected to the time-remaining indicator.

30. A monitor as in one of claims 27–29 further comprising an average-discharging-current memory for storing an average of i, wherein the processor averages i over a defined current-averaging period of time, sets i equal to the average discharging current and stores the average discharging current in the average-discharging-current memory.

31. A monitor as in one of claims 27–29, in which a temperature sensor is located adjacent the battery and is operatively connected to the processor, the sensor for measuring the ambient temperature adjacent the battery, further comprising a nominal-operating-temperature memory operatively connected to the processor, the nominal-operating-temperature memory for storing therein a predefined nominal operating temperature (OPTEMP) of the battery, wherein if a measured ambient temperature adjacent the battery deviates from stored OPTEMP, the processor modifies stored $CCAP_{adj}$ to compensate for such temperature deviation.

* * * * *